(12) United States Patent
Hasegawa

(10) Patent No.: US 6,777,743 B2
(45) Date of Patent: Aug. 17, 2004

(54) INSULATING GATE TYPE SEMICONDUCTOR DEVICE

(75) Inventor: Shigeru Hasegawa, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 103 days.

(21) Appl. No.: 10/061,152

(22) Filed: Feb. 4, 2002

(65) Prior Publication Data

US 2002/0070395 A1 Jun. 13, 2002

Related U.S. Application Data

(63) Continuation of application No. 09/314,115, filed on May 19, 1999, now Pat. No. 6,392,272.

(30) Foreign Application Priority Data

May 19, 1998 (JP) ............................................ 10-136794

(51) Int. Cl.[7] ........................ H01L 29/76; H01L 21/336
(52) U.S. Cl. ........................ 257/329; 257/330; 257/331; 257/332; 257/333; 257/334; 438/259; 438/270; 438/271

(58) Field of Search ................................. 257/329–334, 257/341, 342; 438/259, 270, 271

(56) References Cited

U.S. PATENT DOCUMENTS 5,821,580 A * 10/1998 Kuwahara ................... 257/330

* cited by examiner

*Primary Examiner*—Donghee Kang
(74) *Attorney, Agent, or Firm*—Oblon, Spivak, McClelland, Maier & Neustadt, P.C.

(57) ABSTRACT

An insulating gate type semiconductor device has a plurality of trench gate electrodes provided substantially in parallel. In this semiconductor device, among the trench gate electrodes, a thinning-out trench gate electrode excluding a channel-forming trench gate electrode is insulated from a gate wire and is connected to an emitter electrode or to a predetermined electric potential generating device for generating a negative electric potential with respect to an emitter potential. With this construction, a gate capacitance is decreased without drawbacks such as a decline of manufacturing yield and an increase in gate wire resistance, there are decreased oscillations of waveforms of voltage and current when in switching in the case of an element having a large area and operating the elements in parallel.

10 Claims, 9 Drawing Sheets

INSULATING GATE TYPE SEMICONDUCTOR DEVICE

BACKGROUND OF THE INVENTION

The present invention relates generally to an insulating gate type semiconductor device, and more particularly to a trench gate type IEGT (Injection Enhanced Gate Transistor).

FIG. 1 is a plan view showing a trench gate type IEGT.

The trench gate type IEGT shown in FIG. 1 is structured such that a gate pad 52 and five element regions 54 are disposed within a terminal region 51 provided along a substrate peripheral region for obtaining a withstand voltage. Gate wires 53 are provided at boundaries of the terminal region 51, the gate pad 52 and the five element regions 54. The trench gate type IEGT has striped trench gate electrodes 6 extending as shown in FIG. 1 and disposed inwardly of each element region 54. A voltage applied to the gate pad 52 is transferred to the trench gate electrode 6 through the gate wire 53.

A conventional trench gate type IEGT will hereinafter be described.

FIG. 2 is a sectional view taken along the line A–A' perpendicular to the trench gate electrode 6 of the trench gate type IEGT shown in FIG. 1, showing a structure of a first section of the prior art trench gate type IEGT.

The first section of the prior art trench gate type IEGT shown in FIG. 2 has a structure which follows. An N-type base layer 1 and a P-type base layer 3 are provided in sequence on a P-type emitter layer 2. Striped trenches for forming the trench gate electrode 6 are arranged substantially in parallel and each recessed extending from the substrate surface through the P-type base layer down to an upper portion of the N-type base layer 1, and a gate oxide layer 5 is provided over the substrate surface and a trench internal surface. A trench gate electrode 6 defined as a gate electrode composed of polysilicon with a resistance reduced is provided in an interior of the trench covered with the gate oxide layer 5.

Each set of trench gate electrodes 6 is constituted by fours arranged in sequence in the trench gate type IEGT in the first embodiment of the present invention. Among the four trench gate electrodes 6 constituting one set, the two electrode disposed at both side ends are classified as channel-forming trench gates 6a, and remaining two electrodes interposed therebetween are classified as thinning-out trench gates 6b. An N-type emitter layer 4 is provided in the vicinity of the channel forming trench gate electrode 6a as well as on the substrate surface of the P-type base layer 3 interposed between the channel forming trench gate electrode 6a belonging to one set of electrodes and the channel-forming trench gate electrode 6a belonging to another set of electrodes adjacent to the above one set of electrodes.

An insulating oxide layer 7 is formed covering some portions or the whole of the upper surfaces of the channel-forming trench gates 6a and the gate oxide layers 5 on the substrate surface. A contact hole 10 is holed in the insulating oxide layer 7 and the gate oxide layer 5 at the center of an inter-trench area formed with the N-type emitter layer 4. An emitter electrode 8 is provided over the entire surface of the substrate surface, covering all these layers and hole described above. Moreover, a collector electrode 9 is provided covering the entire surface of the P-type emitter layer 2 on the underside of the substrate. Accordingly, the emitter electrode 8 is connected at the contact hole 10 to the N-type emitter layer 4 and the P-type base layer 3.

In the trench gate type IEGT, the contact on the side of the emitter is not formed in all the inter-trench areas. In the case of the prior art trench gate type IEGT shown in FIG. 2, there is provided the contact region in which the single contact hole 10 is holed for every four inter-trench areas, and therefore a ratio of the total number of inter-trench areas to the number of the contact regions is 4:1.

The thinning-out trench gate electrode 6b, though not used for forming a channel, performs a role of preventing a decrease in element withstand voltage with such a contrivance that when in a forward voltage application, a depletion layer formed extending to a portion peripheral to a tip of the channel-forming trench gate electrode 6a is fused with a depletion layer formed extending to a portion peripheral to a tip of the thinning-out trench gate electrode 6b adjacent to the channel-forming trench gate electrode 6a, and a curvature of the depletion layer at the portion peripheral to the tip of the channel-forming trench gate electrode 6a is relieved. Accordingly, if the thinning-out trench gate electrode 6b is not provided, the element withstand voltage is to decrease.

FIG. 3 is a sectional view showing a structure of a second section of the trench gate type IEGT in the prior art, i.e., a sectional structure taken along the straight line B–B' intersecting a direction parallel to the trench gate electrode 6b with respect to the gate wire 53 of the trench gate type IEGT shown in FIG. 1.

The second section of the prior art trench gate type IEGT shown in FIG. 3 takes the following structure. The N-type base layer 1 is provided on the P-type emitter layer 2, and a P+ layer 13 is formed on the N-type base layer 1 at a portion under the gate wire 53 shown in FIG. 1. An insulating oxide layer 14 is provided on the gate wire region on the P+ layer 13. The trenches are formed on both sides of the P+ layer 13, and the gate oxide layer 5 is provided covering these components. The tench gate electrode 6 composed of the polysilicon is provided inwardly of the trench covered with the gate oxide layer 5. A trench gate drawing region 6' composed of the polysilicon as in the same way with the trench gate electrode 6, is provided covering side ends of the trench gate electrode 6 on the side of the P+ layer 13, and an area of the gate oxide layer 5 which exists on the insulating oxide layer 14 and the P+ layer 13. The trench gate drawing region 6' is connected to the side ends of the trench gate electrode 6 on the side of the P+ layer 13, whereby the trench gate electrode 6 is drawn out to the gate wire 53 and thus connected to the gate wire 53. The insulating oxide layer 7 is provided on the trench gate drawing region 6', and the gate wire region of the insulating oxide layer 7 is removed. A gate-wire-oriented metal 15 for reducing a resistance is provided on the trench gate drawing region 6' from above the insulating oxide layer 7 with the gate wire region removed. The gate wire 53 is constructed of the gate wire-oriented metal 15 and the trench gate drawing region 6'. The emitter electrode 8 is provided on a region of the insulating oxide layer 7, wherein the trench gate electrode 6 is formed.

FIG. 4 is a plan view showing, in a region C in FIG. 1, the prior art trench gate type IEGT. Note that FIG. 2 is a sectional structural view taken along the straight line A–A' perpendicular to the trench gate electrodes 6 (6a and 6b) shown in FIG. 4.

As illustrated in FIG. 4, the trench gate electrodes 6a, 6b are formed in a stripe shape alternately at a predetermined interval, and arranged in sequence by fours as one set. Among one set of four trench gate electrodes 6, two electrodes disposed at both side ends are classified as the channel forming trench gate electrodes 6a, and the remaining two electrodes interposed therebetween are classified as the thinning-out trench gate electrodes 6b. The insulating oxide layer 7 (not shown in FIG. 4) in FIG. 2 or 3 is formed covering some portions or the whole of the upper surfaces of the trench gates 6a, 6b. The contact hole 10 is holed in an area interposed between the channel-forming trench gate electrode 6a belonging to one set of electrodes and the channel-forming trench gate electrode 6a belonging to another set of electrodes adjacent to above one set of electrodes. The emitter electrode 8 (which is not shown in FIG. 4) in FIG. 2 or 3 is connected at the contact hole 10 to the N-type emitter layer 4 and the P-type base layer 3. Further, each of the channel-forming trench gate electrode 6a and the thinning-out trench gate electrode 6b is, with a structure of drawing the polysilicon out of side end thereof, connected to the gate wire 53.

In the prior art trench gate type IEGT shown in FIGS. 2 to 4, as explained above, there is adopted the contact thinning-out structure which involves providing the thinning-out trench gate electrode 6b. With this structure, a low forward ON-voltage is attained by increasing a hole discharge resistance and an electron implantation efficiency and when the element is in an ON-state (For further details of the prior art trench gate type IEGT, refer to "A 4500V Injection Enhanced Insulated Gate Bipolar Transistor (IEGT) in a Mode Similar to a Thyristor", IEDM'93, pp.679–682.' by 'M. Kitagawa, I. Omura, S. Hasegawa, T. Inoue and A. Nakagawa).

In the prior art trench gate type IEGT described above, however, the thinning-out trench gate electrode is also connected to the gate pad, and a gate capacitance between the gate/collector electrode in creases, resulting in a problem wherein large oscillations of waveforms of voltage and current when in switching are caused in the case of an element having a large area and operating the elements in parallel.

SUMMARY OF THE INVENTION

Accordingly, it is a primary object of the present invention to provide an insulating gate type semiconductor device capable of reducing voltage waveform oscillations of waveforms of voltage and current and an electric current when in switching in the case of a element having a large area and operating the elements in parallel by decreasing a gate capacitance without causing drawbacks such as a decline of manufacturing yield and a rise in gate wire resistance etc.

To accomplish the above object, according to one aspect of the present invention, an insulating gate type semiconductor device comprises a plurality of trench gate electrodes provided substantially in parallel, wherein among the trench gate electrodes, a thinning-out trench gate electrode excluding a channel-forming trench gate electrode is insulated from a gate wire and is connected to an emitter electrode or to a predetermined electric potential generating device for generating a negative electric potential with respect to an emitter potential. Namely, the thinning-out trench gate electrode is structured so that its electric potential is always equal or negative to an emitter potential. With this structure, it is possible to obtain the trench gate type IEGT capable of reducing the gate capacitance without inducing a drop in element withstand voltage and decreasing the oscillations of waveforms of voltage and current when in switching in the case 1f the element having the large area and operating the elements in parallel.

According to another aspect of the present invention, an insulating gate type semiconductor device comprises a plurality of trench gate electrodes provided in a plurality of trenches arranged substantially in parallel and recessed at a first distance and a second distance alternately to a predetermined depth extending to an upper portion of an N-type base layer from the surface of a semiconductor substrate on which a P-type emitter layer, the N-type base layer and a P-type base layer are formed in sequence from the underside thereof to the surface thereof, wherein the trench gate electrodes are defined as channel-forming trench gate electrodes for forming a channel, one set of the trench gate electrodes is constituted by twos arranged in sequence, and the predetermined depth of the trench is set to such an extent that a depletion layer formed extending from a tip of the channel-forming trench gate electrode when in a forward voltage application is fused with a depletion layer formed extending from a junction area between the N-type base layer and the P-type base layer to which the trench gate electrode is vicinal and that a curvature of the depletion layer at the tip of the trench gate electrode is relieved.

The predetermined depth of the trench is such a depth that a depth from the junction surface between the N-type base layer and the P-type base layer is, to be specific, 3 µm or under. With this configuration, the curvature of the depletion layer at the tip of the trench gate electrode is relieved, and hence, even if the thinning-out trench gate electrode is not provided, it never happens that the element withstand voltage decreases, with the result that the thinning-out trench gate electrode is not required. Accordingly, there is no necessity for a connection area between the thinning-out trench gate electrode and the emitter electrode. This might lead advantages in which the manufacturing yield is highly enhanced, and, in addition, there occurs no such problem that a crystal distortion is caused due to an internal stress of the trench with a reduced number of trenches within one element. Further, there is no thinning-out trench gate electrode disposed in close proximity to the channel-forming trench gate electrode, and consequently a gate capacitance between the gate and the emitter is reduced. It is feasible to obtain the trench gate type IEGT capable of, as will be demonstrated in the embodiments which follow, decreasing the oscillations of waveforms of voltage and current and the electric current when in switching in the case of the element having the large area and operating the elements in parallel.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Embodiments of an insulating gate type semiconductor device according to the present invention will be described with reference to the accompanying drawings.

Figure 1:
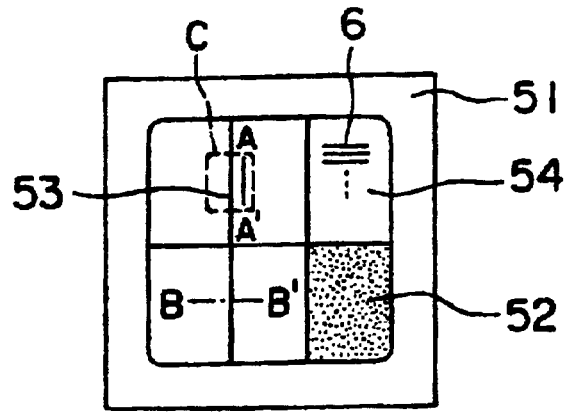
FIG. 1 is a plan view showing a trench gate type IEGT.
Figure 2:
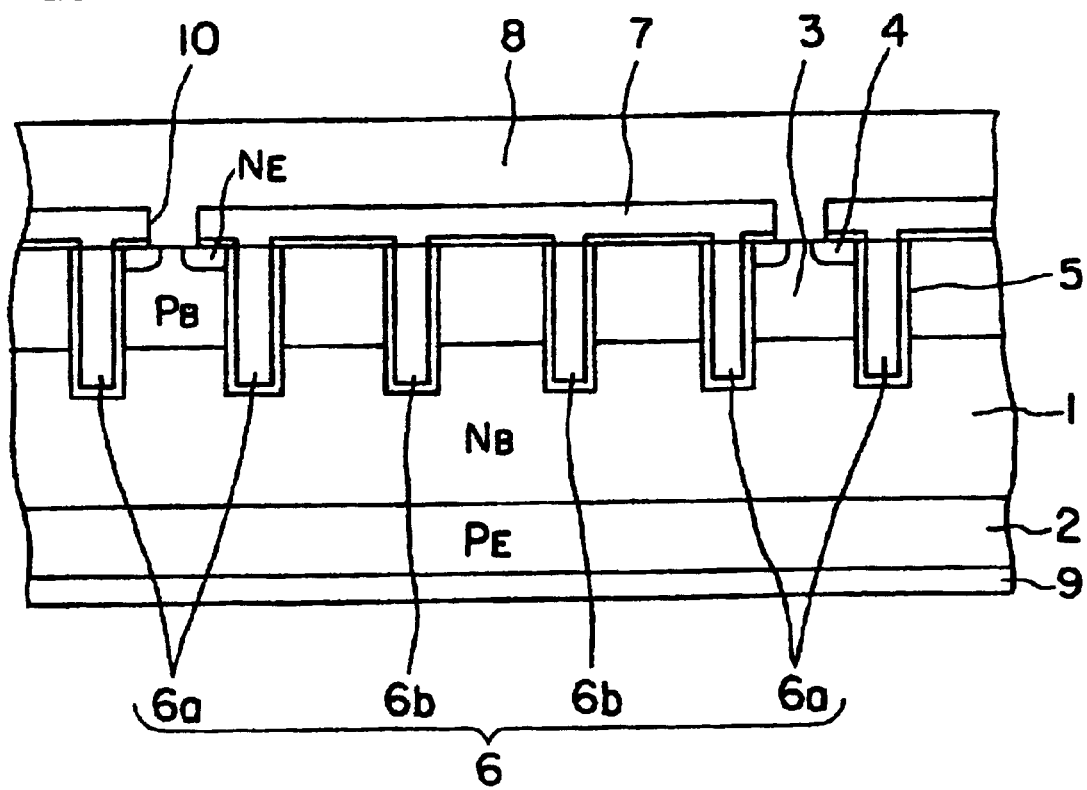
FIG. 2 is a sectional view showing a structure of a first section of a prior art trench gate type IEGT.
Figure 5:
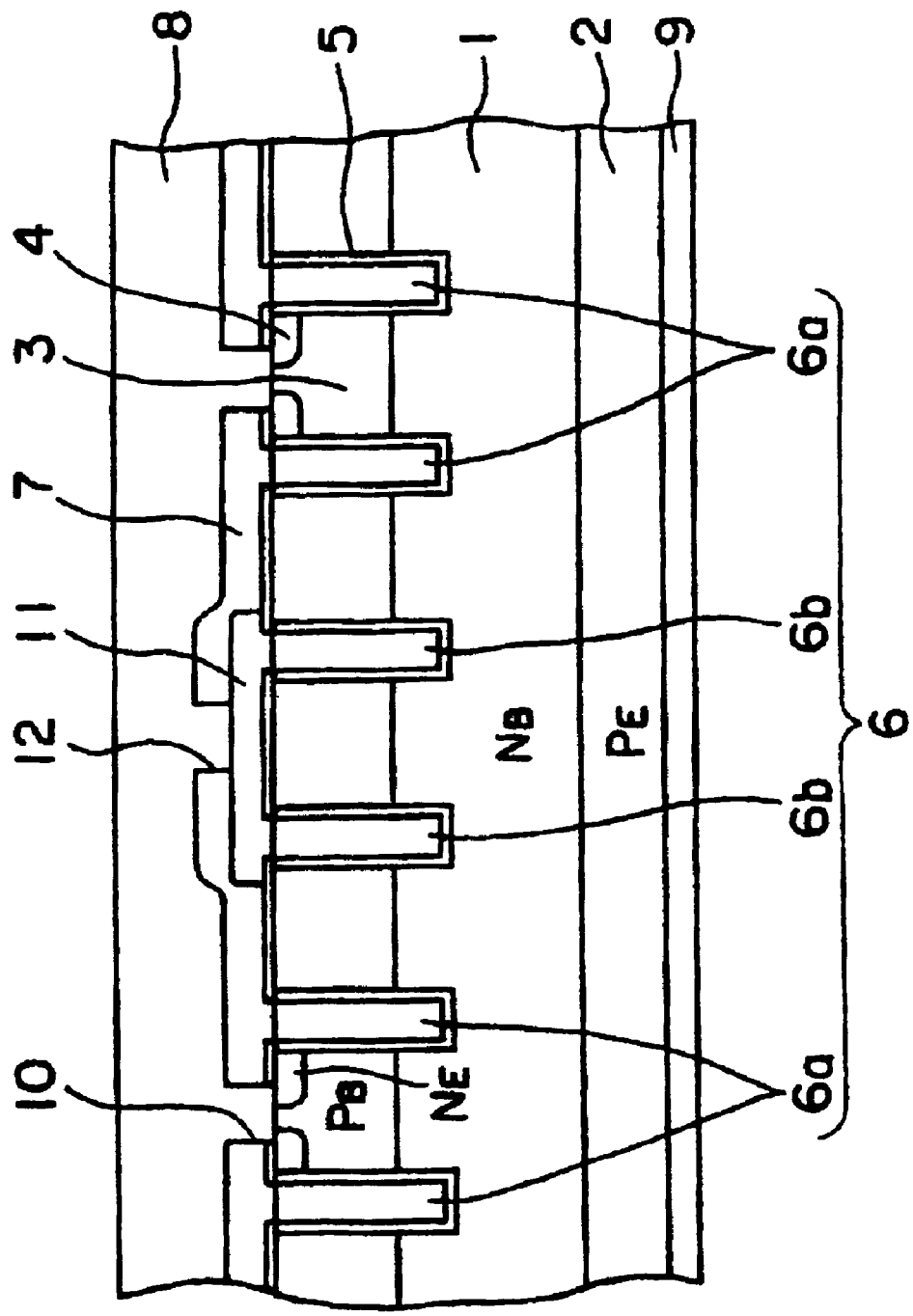
FIG. 5 is a sectional view showing a structure of a first section of an insulating gate type semiconductor device (a trench gate type IEGT) in a first embodiment of the present invention.

FIG. 5 is a sectional view showing a structure of a first section, taken along the straight line A–A' perpendicular to a trench gate electrode 6 of the trench gate type IEGT shown in FIG. 1, of the insulating gate type semiconductor device (trench gate type IEGT) in a first embodiment of the present invention. FIG. 5 is the view corresponding to FIG. 2 showing the prior art trench gate type IEGT.

The sectional structure of the trench gate type IEGT in the first embodiment of the present invention illustrated in FIG. 5, takes the following configuration. An N-type base layer 1 and a P-type base layer 3 are provided in sequence on a P-type emitter layer 2. Striped trenches for forming a trench gate electrode 6 are recessed substantially in parallel at a predetermined interval extending from the substrate surface through the P-type base layer 3 down to an upper portion of the N-type base layer 1. A gate oxide layer 5 is formed on the substrate surface and internal surfaces of the trenches. The trench gate electrode 6 defined as a gate electrode composed of polysilicon with a resistance reduced, is provided in the interior of the trench covered with the gate oxide layer 5.

Each set of trench gate electrodes 6 is constituted by fours arranged in sequence in the trench gate type IEGT in the first embodiment of the present invention. Among the four trench gate electrodes 6 constituting one set, the two electrodes disposed at both side ends are classified as channel forming trench gates 6a, and remaining two electrodes interposed therebetween are classified as thinning-out trench gates 6b. An N-type emitter layer 4 is provided in the vicinity of the channel forming trench gate electrode 6a as well as on the substrate surface of the P-type base layer 3 interposed between the channel forming trench gate electrode 6a belonging to one set of electrodes and the channel forming trench gate electrode 6a belonging to another set of electrodes adjacent to the above one set of electrodes. Then, the thinning-out trench electrodes 6b belonging to the respective sets of electrodes are connected to each other through polysilicon layers 11 with a resistance reduced, which are formed covering some portions or the whole of the upper surfaces of the thinning-out trench gates 6b and the gate oxide layers 5 on the substrate surface with the same material as the trench gate electrode 6.

An insulating oxide layer 7 is formed covering the polysilicon layers 11 and some portions or the whole of the upper surfaces of the channel-forming trench gates 6a and the gate oxide layers 5 on the substrate surface. A contact hole 10 is holed in the insulating oxide layer 7 and the gate oxide layer 5 at the center of an inter-trench area formed with the N-type emitter layer 4. Further, a contact hole 12 is holed in the insulating oxide layer 7 at a portion on the polysilicon layer 11, in which to connect each of the thinning-out trench gates 6b. An emitter electrode 8 is provided over the entire surface of the substrate surface, covering all these layers and holes described above. Moreover, a collector electrode 9 is provided covering the entire surface of the P-type emitter layer 2 on the underside of the substrate. Accordingly, the emitter electrode 8 is connected at the contact hole 10 to the N-type emitter layer 4 and the P-type base layer 3, and connected at the contact hole 12 to the polysilicon layer 11 for connecting each of the thinning-out trench gate electrodes 6b.

Figure 4:
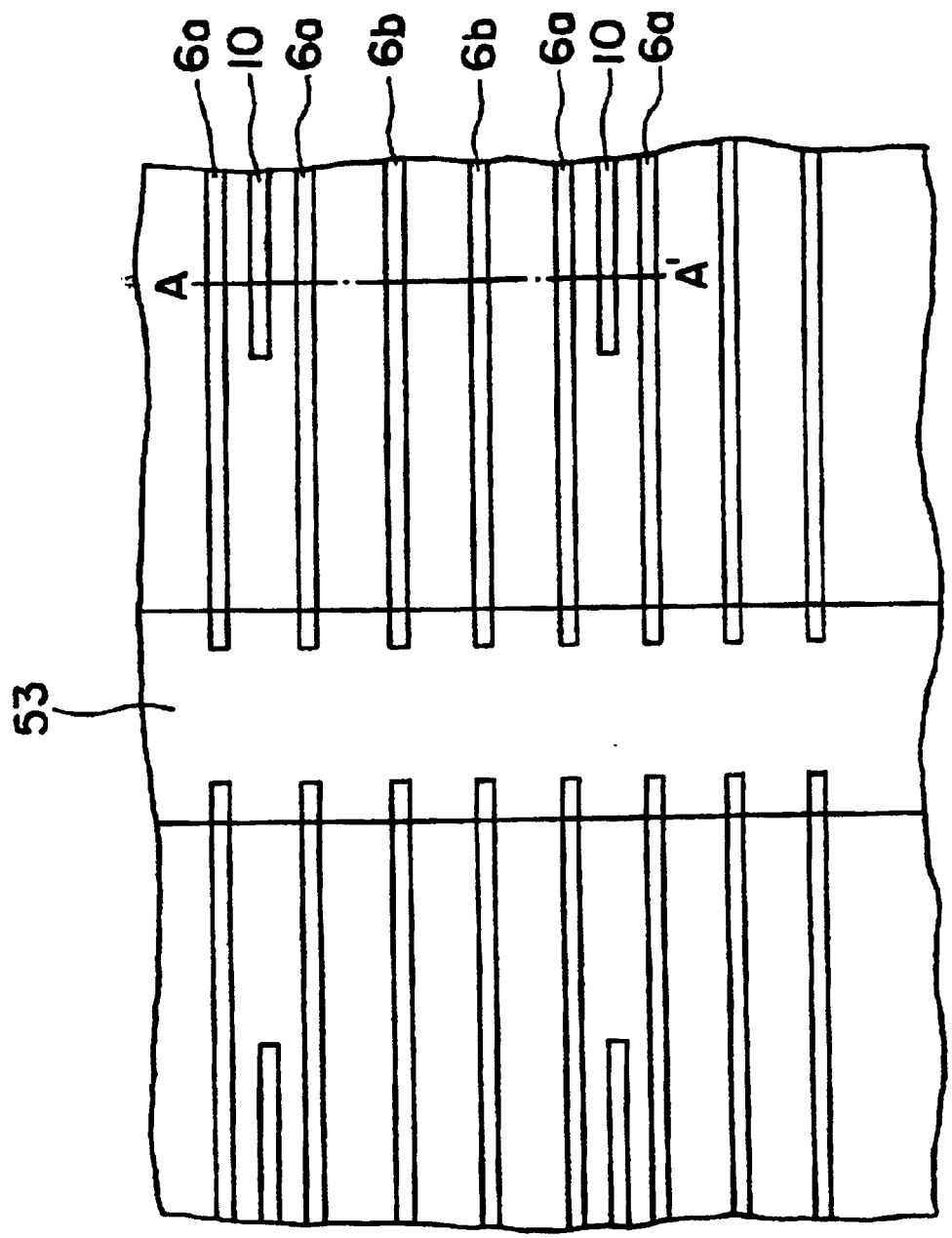
FIG. 4 is a plan view showing the prior art trench gate type IEGT.
Figure 6:
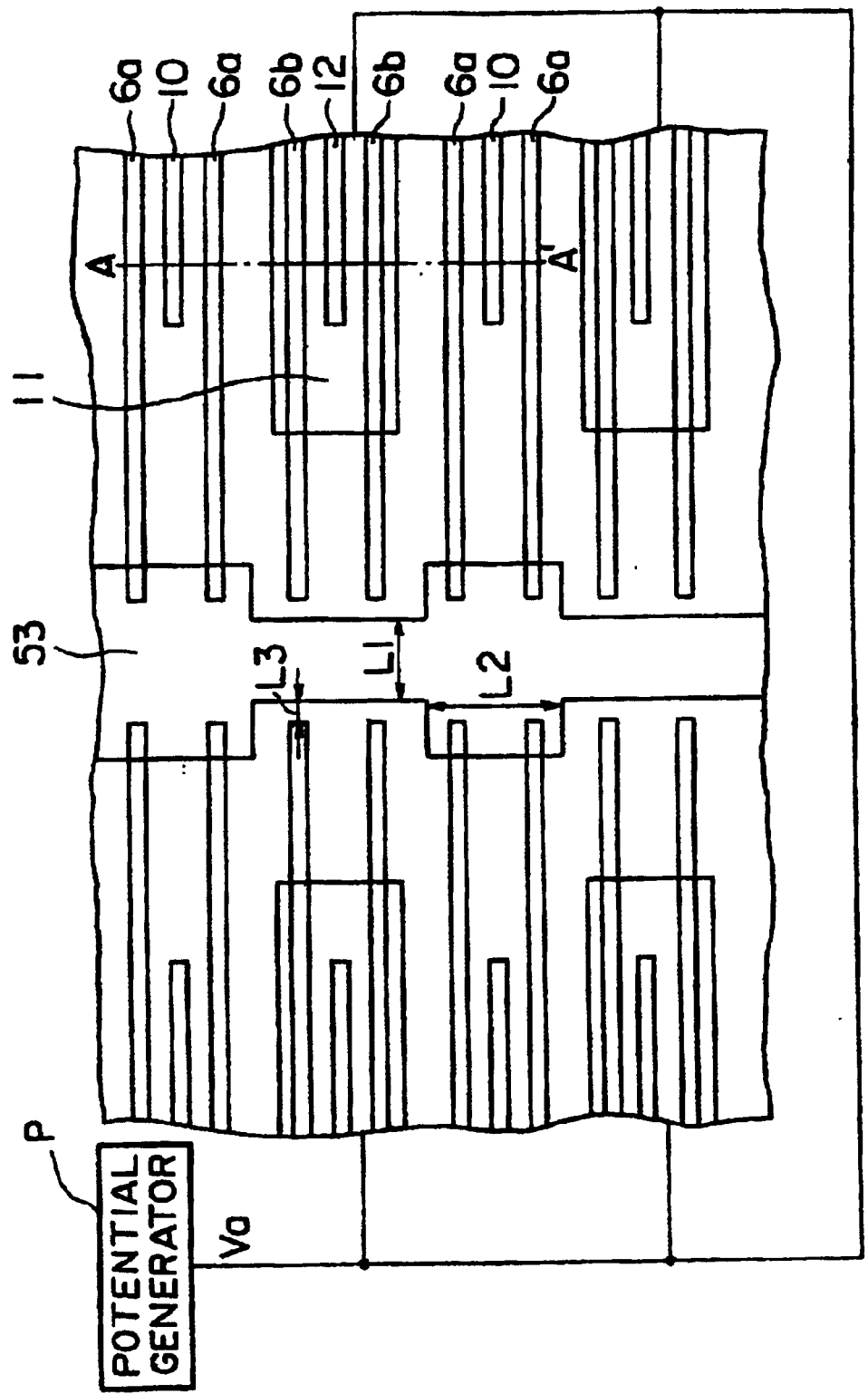
FIG. 6 is a plan view of the trench gate type IEGT in a region C in FIG. 1 in the first embodiment of the present invention.

FIG. 6 is a plan view showing, in a region C in FIG. 1, a trench gate type IEGT in the first embodiment of the present invention, and corresponds to FIG. 4 illustrating the prior art trench gate type IEGT. Note that FIG. 5 is a sectional structural view taken along the straight line A–A' perpendicular to the trench gate electrodes 6 (6a and 6b) shown in FIG. 6.

As illustrated in FIG. 6, the trench gate electrodes 6a, 6b are formed in a stripe shape at a predetermined interval, and arranged in sequence by fours as one set. Among one set of four trench gate electrodes 6, two electrodes disposed at both side ends are classified as the channel forming trench gate electrodes 6a, and the remaining two electrodes interposed therebetween are classified as the thinning-out trench gate electrodes 6b. the two thinning-out trench electrodes 6b belonging to the respective sets of electrodes are connected to each other through the polysilicon layers 11 formed covering some portions or the whole of the upper surfaces thereof.

The insulating oxide layer 7 (not shown in FIG. 6) in FIG. 5 is formed covering some portions or the whole of the upper surfaces of the trench gates 6a, 6b. The contact hole 10 is holed in an area interposed between the channel-forming trench gate electrode 6a belonging to one set of electrodes and the channel-forming trench gate electrode 6a belonging to another set of electrodes adjacent to above one set of electrodes. The emitter electrode 8 (which is shown neither in FIG. 6 nor in the following Figures) in FIG. 5 is connected at the contact hole 10 to the N-type emitter layer 4 and the P-type base layer 3. Further, the insulating oxide layer 7 has the contact hole 12 holed in an area interposed between the two thinning-out trench gate electrodes 6b being to each set of electrodes. The emitter electrode 8 in FIG. 5 is connected at the contact hole 12 to the polysilicon layer 11. Each channel-forming trench gate electrode 6a among the respective trench gate electrodes 6a, 6b is, as in the case of the prior art structure, connected to a gate wire 53 with a structure of drawing the polysilicon out of side end thereof. Each thinning-out trench gate electrode 6b is not, however, connected to the gate wire 53. Therefore, the gate wire 53 has a larger width at the portion formed with the channel-forming trench gate electrode 6a, and a smaller width at the portion formed with the thinning-out trench gate electrode 6b. The gate wire 53 may take such a configuration that the thinning-out trench gate electrode 6b is unconnected.

Figure 3:
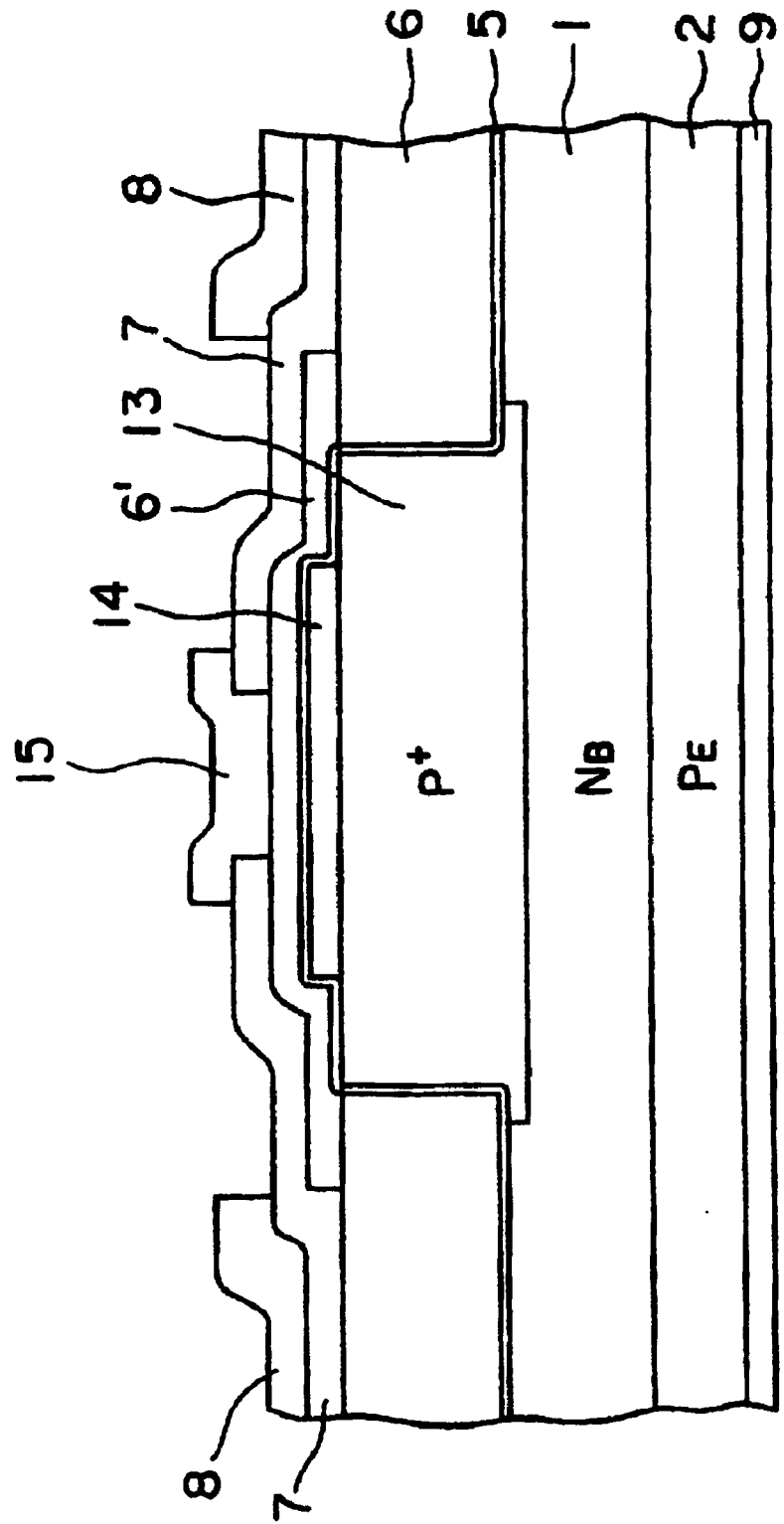
FIG. 3 is a sectional view showing a structure of a second section of the prior art trench gate type IEGT.

Explained next referring to FIG. 3 is a sectional structure taken along the straight line B–B' shown in FIG. 1 in the trench gate type IEGT in the first embodiment of the present invention, i.e., a sectional structure of the section corresponding to the second section of the prior art trench gate type IEGT shown in FIG. 3. If the trench gate electrode 6 shown in FIG. 3 is defined as the channel-forming trench gate electrode 6a, the sectional structure is absolutely the same. By contrast, however, if the trench gate electrode 6 shown in FIG. 3 is defined as the thinning-out trench gate electrode 6b, the sectional structure becomes different as shown in FIG. 7 as will be touched upon in the following discussion.

Figure 7:
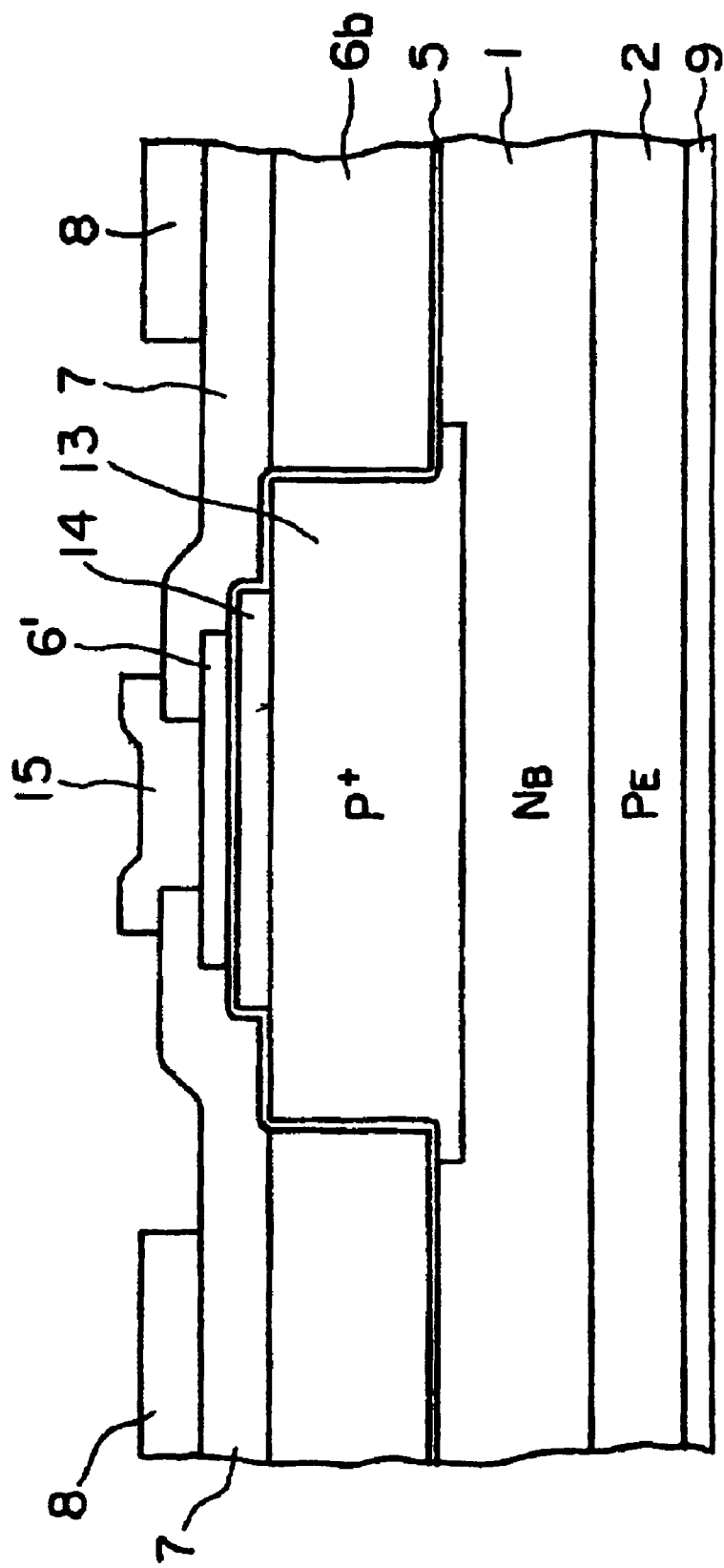
FIG. 7 is a sectional view showing a structure of a second section of the trench gate type IEGT in the first embodiment of the present invention.

FIG. 7 is a sectional view showing a structure of a second section of the trench gate type IEGT in the first embodiment of the present invention, i.e., a sectional structure taken along the straight line B–B' intersecting a direction parallel to the thinning-out trench gate electrode 6*b* with respect to the gate wire 53 of the trench gate type IEGT shown in FIG. 1.

The second section of the trench gate type IEGT in the first embodiment of the present invention shown in FIG. 7 takes the following structure. The N-type base layer 1 is provided on the P-type emitter layer 2, and a P$^+$ layer 13 is formed on the N-type base layer 1 at a portion under the gate wire 53 shown in FIG. 1. An insulating oxide layer 14 is provided on the gate wire region on the P$^+$ layer 13. The trenches are formed on both sides of the P$^+$ layer 13, and the gate oxide layer 5 is provided covering these components. The thinning-out tench gate electrode 6*b* composed of the polysilicon is provided inwardly of the trench covered with the gate oxide layer 5. A trench gate drawing region 6' composed of the polysilicon as in the same way with the thinning-out trench gate electrode 6*b*, is provided covering an area of the gate oxide layer 5 which exists on the insulating oxide layer 14 and above the P$^+$ layer 13. The trench gate drawing region 6' is, as described above, connected to the channel-forming trench gate electrode 6*a* but is not connected to the thinning-out trench gate electrode 6*b*. The insulating oxide layer 7 is provided over the thinning-out trench gate electrode 6*b*, the trench gate drawing region 6', the insulating oxide layer 14 and the P$^+$ layer 13. The gate wire region of the insulating oxide layer 7 is removed. A metal 15 for the gate wire is provided on the trench gate drawing region 6' from above the insulating oxide layer 7 with the gate wire region removed. The gate wire 53 is constructed of the gate wire-oriented metal 15 and the trench gate drawing region 6'. The emitter electrode 8 is provided on a region of the insulating oxide layer 7, wherein the trench gate electrode 6 is formed.

As discussed above, in the trench gate type IEGT in the first embodiment of the present invention, the thinning-out trench gate electrode 6*b* is connected to the emitter electrode 8 but unconnected to the gate wire 53, whereby an electric potential of the thinning-out trench gate electrode 6*b* is fixed to an emitter potential. As a result, a gate capacitance is decreased without inducing a decline of an element withstand voltage, and it is feasible to obtain the trench gate type IEGT of which oscillations of waveforms of voltage and current when in switching are small in the case of a large-area element and when operating the elements in parallel.

Further, as explained above, in the trench gate type IEGT, the contact on the side of the emitter is not provided in all the inter-trench areas. In the case of the first embodiment, there is provided the contact region in which the single contact hole 10 is holed for every four inter-trench areas, and therefore a ratio of the total number of inter-trench areas to the number of the contact regions is 4:1. As this ratio increases such as 5:1, 6:1, . . . , the gate capacitance becomes by far smaller with the construction of the present invention being taken, and hence the present invention exhibits a much greater effect.

For obtaining the above effect, the electric potential of the thinning-out trench gate electrode 6*b* may be equal or negative to the emitter potential. If negative to the emitter potential, a dedicated electric potential generating device is specially needed without providing the contact hole 12. For example, as shown in FIG. 6, there is provided an electric potential generating device P for generating an electric potential Va equal or negative to the emitter potential, and the thinning-out trench gate electrode 6*b* or the polysilicon layer 11 is connected to the electric potential generating device P, thereby giving the electric potential Va to the thinning-out trench gate electrode 6*b*. Normally, however, as structured in this embodiment, the thinning-out trench gate electrode 6*b* is connected to the emitter electrode 8, and the electric potential of the thinning-out trench gate electrode 6*b* is thereby equalized to the emitter potential, with the result that the dedicated electric potential generating device P is not required.

Figure 8:
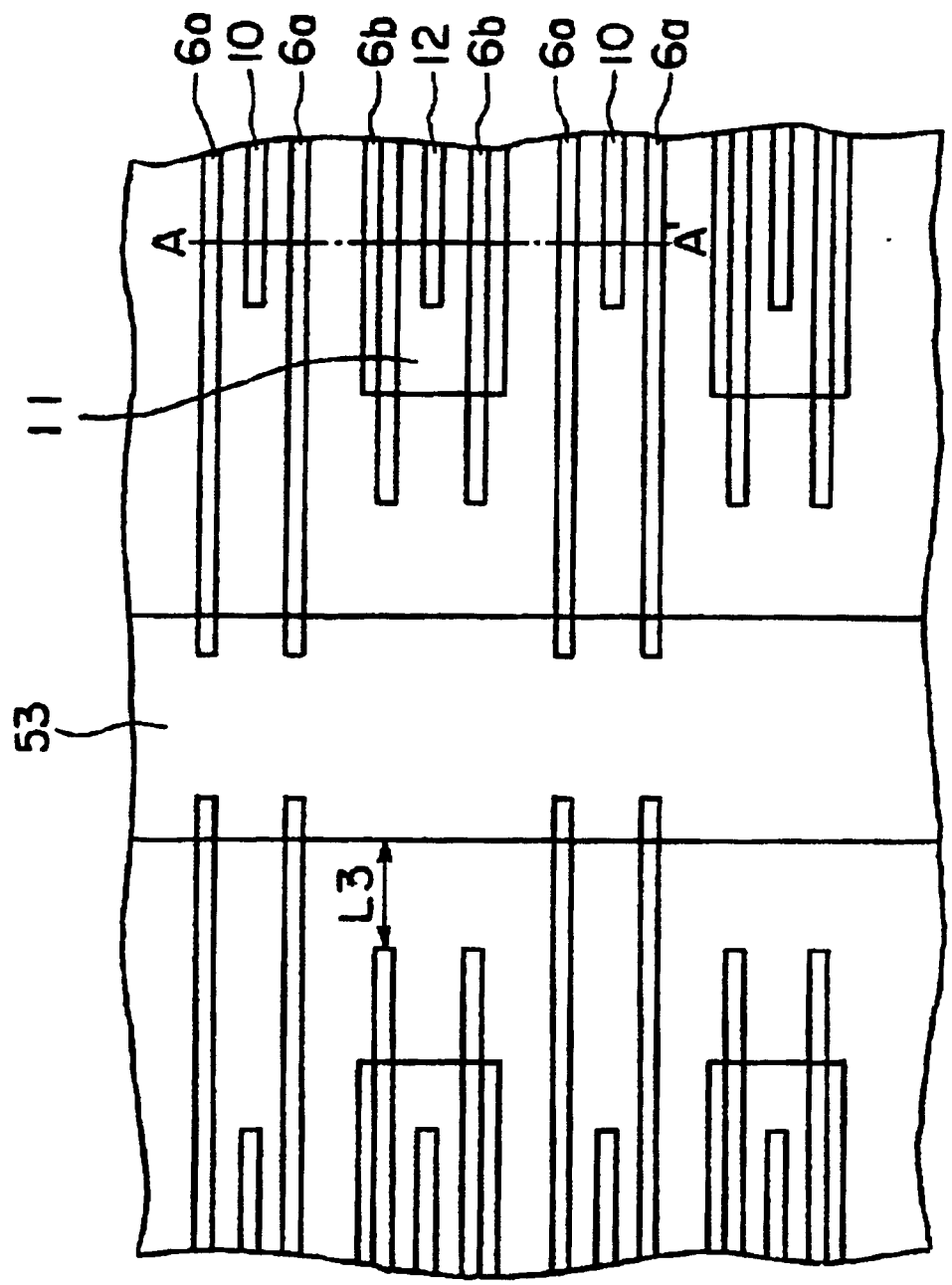
FIG. 8 is a plan view showing the insulating gate type semiconductor device (the trench gate type IEGT) in the region C in FIG. 1 in a second embodiment of the present invention.

FIG. 8 is a plan view showing, in the region C in FIG. 1, an insulating gate type semiconductor device (trench gate type IEGT) in a second embodiment of the present invention, and corresponds to FIG. 6 illustrating the trench gate type IEGT in the first embodiment of the present invention. Note that FIG. 5 is the sectional structural view taken along the straight line A–A' perpendicular to the trench gate electrodes 6 (6*a* and 6*b*) shown in FIG. 8.

The trench gate type IEGT in the second embodiment of the present invention has substantially the same structure as that in the first embodiment, and especially the sectional structure taken along the straight line A–A' is absolutely the same as the sectional structure in the first embodiment shown in FIG. 5. As illustrated in the plan view of FIG. 8, however, the configuration in the vicinity of the gate wire 53 is partially different. To be specific, among the trench gate electrodes 6 (6*a* and 6*b*), the channel-forming trench gate electrode 6*a* is, as in the first embodiment, connected to the gate wire 53 by providing the drawing region composed of the polysilicon layer. The thinning-out trench gate electrode 6*b* is, however, unconnected to the gate wire 53 and therefore formed with its length in the longitudinal direction being shorter than the channel-forming trench gate electrode 6*a* so that a side end thereof is spaced away from the gate wire 53. Accordingly, the gate wire 53 is formed with a proper fixed width, whereby the channel-forming trench gate electrode 6*a* is connected to the gate wire 53 while the thinning-out trench gate electrode 6*b* is unconnected thereto.

Explained further referring to FIG. 3 is a sectional structure taken along the straight line B–B' shown in FIG. 1 in the trench gate type IEGT in the second embodiment of the present invention, i.e., a sectional structure of the section corresponding to the second section of the prior art trench gate type IEGT shown in FIG. 3. If the trench gate electrode 6 shown in FIG. 3 is defined as the channel-forming trench gate electrode 6*a*, the sectional structure is the same as the sectional structure shown in FIG. 3. By contrast, however, if the trench gate electrode 6 shown in FIG. 3 is defined as the thinning-out trench gate electrode 6*b*, the sectional structure becomes different as shown in FIG. 9 as will be touched upon in the following discussion.

Figure 9:
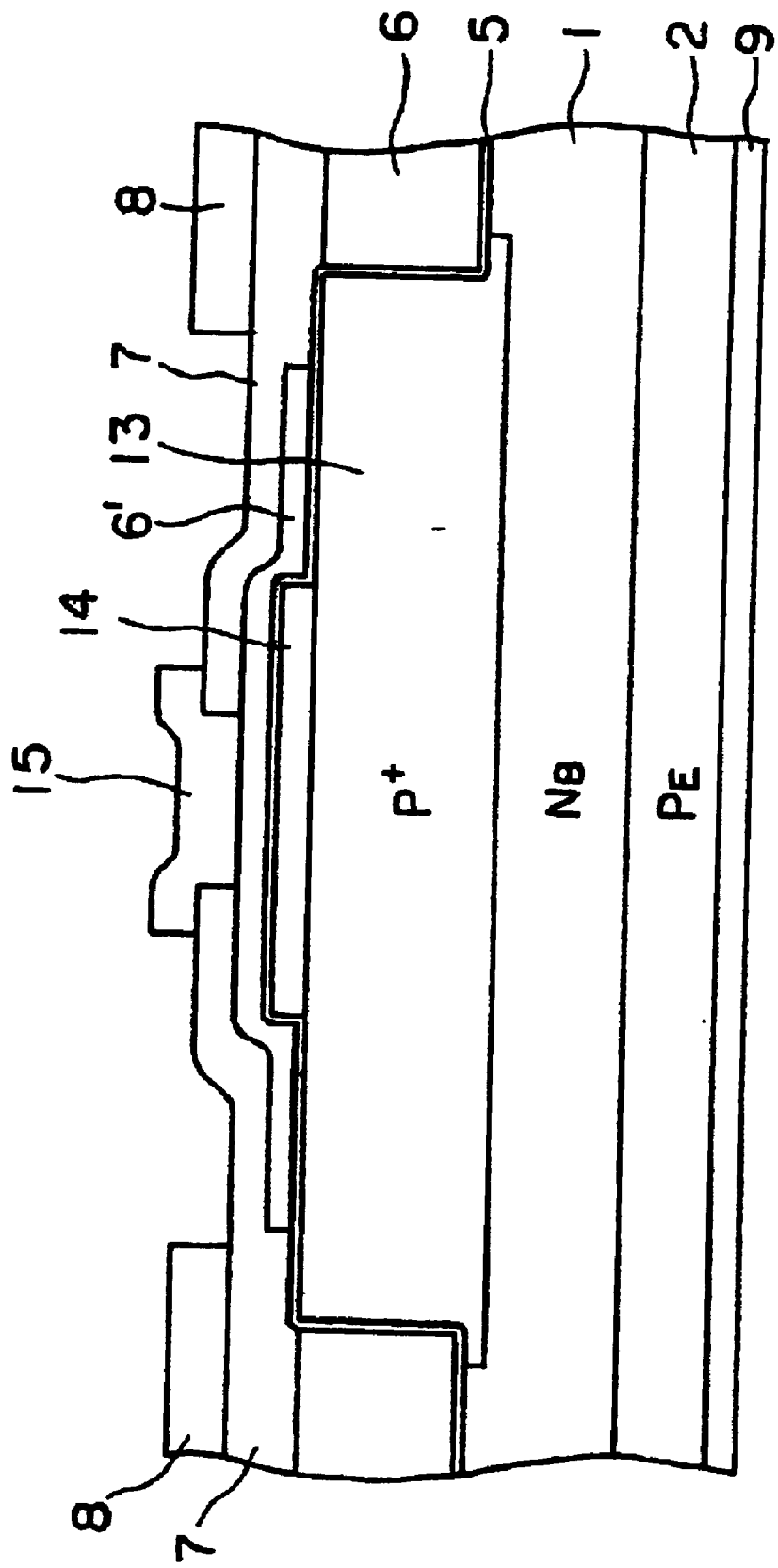
FIG. 9 is a sectional view showing a structure of the trench gate type IEGT in the second embodiment of the present invention.

FIG. 9 is a sectional view showing a structure of a section of the trench gate type IEGT in a second embodiment of the present invention, i.e., a sectional structure taken along the straight line B–B' intersecting the direction parallel to the thinning-out trench gate electrode 6*b* with respect to the gate wire 53 of the trench gate type IEGT shown in FIG. 1.

The second section of the trench gate type IEGT in the second embodiment of the present invention shown in FIG. 9 takes the following structure. The N-type base layer 1 is provided on the P-type emitter layer 2, and the P$^+$ layer 13 is provided on the N-type base layer 1 at a portion under the gate wire 53 shown in FIG. 1. The insulating oxide layer 14 is formed in a gate wire region on the P$^+$ layer 13. The trenches are formed on both sides of the P$^+$ layer 13, and the gate oxide layer 5 is formed covering these trenches and the P+ layer 13. The trenches in the second section are, however, used for providing the thinning-out trench gate electrodes 6b. As discussed above, the trenches are formed so that the side ends of the trenches on the side of the gate wire 53 are formed in positions spaced well away from the gate wire 53 in order to make the thinning-out trench gate electrodes 6b unconnected to the gate wire 53. The trench gate electrodes 6 each composed of the polysilicon are provided within the trenches covered with the gate oxide layer 5. Incidentally, it is desired for preventing a decreased in the withstand voltage that the side ends of the thinning-out trench gate electrodes 6b be covered with the P+ layer 13 as illustrated in FIG. 9. Accordingly, when forming the P+ layer 13, a region for forming the P+ layer 13 may be so set as to include regions in which the side end of the thinning-out trench gate electrodes 6b are to be formed. The trench gate drawing region 6' composed of the polysilicon as in the same way with the trench gate electrode 6, is provided covering an area of the gate oxide layer 5 which exists on the insulating oxide layer 14 and above the P+ layer 13. The trench gate drawing region 6' is, as described above, connected to the channel-forming trench gate electrode 6a and is, with the side end of the thinning-out trench gate electrode 6b being formed in the position spaced well away from the gate wire 53, unconnected to the thinning-out trench gate electrode 6b. The insulating oxide layer 7 is provided over the trench gate drawing region 6', and the gate wire region of the insulating oxide layer 7 is removed. The gate wiring metal 15 for reducing the resistance is provided on the trench gate drawing region 6' from above the insulating oxide layer 7 with the gate wire region removed. The gate wire 53 is constructed of the gate wiring metal 15 and the trench gate drawing region 6'. The emitter electrode 8 is provided on a region of the insulating oxide layer 7, wherein the trench gate electrode 6 is formed.

As illustrated in FIG. 6, in the trench gate type IEGT in the first embodiment of the present invention, the channel-forming trench gate electrode 6a and the thinning-out trench gate electrode 6b are equal in terms of their length in the longitudinal direction. Therefore, the channel-forming trench gate electrode 6a is connected to the gate wire 53, while the thinning-out trench gate electrode 6b is unconnected to the gate wire 53. For attaining this configuration, the gate wire 53 has a larger width at the portion formed with the channel-forming trench gate electrode 6a, and a smaller width at the portion formed with the thinning-out trench gate electrode 6b.

In this configuration, however, there decrease a width L1 of the gate wire 53 at the portion formed with the thinning-out trench gate electrode 6b and a width L2 of the gate drawing region of the channel-forming trench gate electrode 6a. Consequently, there must be such a drawback that a gate wire resistance increases, and, in the case of the element having a large area, a switching speed decreases. Further, when trying to increasing the width L1 of the gate wire 53 in order to avoid the problem of causing the increase in the gate wire resistance, there is no alternative but to diminish a spacing L3 between the gate wire 53 and the side end of the thinning-out trench gate electrode 6b which should be unconnected to the gate wire 53. If this spacing L3 is made too small, however, an adhesion of dusts etc during the manufacturing process makes it easier for the gate wire 53 to come into contact with the side end of the thinning-out trench gate electrode 6b, and there might be a possibility in which a decrease in yield is induced.

Such being the case, as in the case of the trench gate type IEGT in the second embodiment of the present invention shown in FIGS. 8 and 9, the thinning-out trench gate electrode 6b is formed so that its length in the longitudinal direction is shorter than the channel-forming trench gate electrode 6a, and the gate wire 53 is formed with a proper fixed width. This leads to the configuration in which the channel-forming trench gate electrode 6a is connected to the gate wire 53 while avoiding the increase in the gate wire resistance, whereas the thinning-out trench gate electrode 6b is unconnected thereto. With this configuration, the spacing L3 between the side end of the thinning-out trench gate electrode 6b and the gate wire 53 can be sufficiently ensured by properly setting the length of the thinning-out trench gate electrode 6b in the longitudinal direction, and consequently there might be no possibility of inducing the decrease in the yield due to the cause described above.

The thinning-out trench gate electrode 6b is connected to the emitter electrode 8 but is unconnected to the gate wire 53, and the electric potential of the thinning-out trench gate electrode 6b is fixed to the emitter potential. This makes it feasible to reduce the gate capacitance without causing the drop in the element withstand voltage and to obtain the trench gate type IEGT of which oscillations of waveforms of voltage and current when in switching are small in the case of the element having the large area and operating the elements in parallel. These effects are the same as those in the first embodiment.

Figure 10:
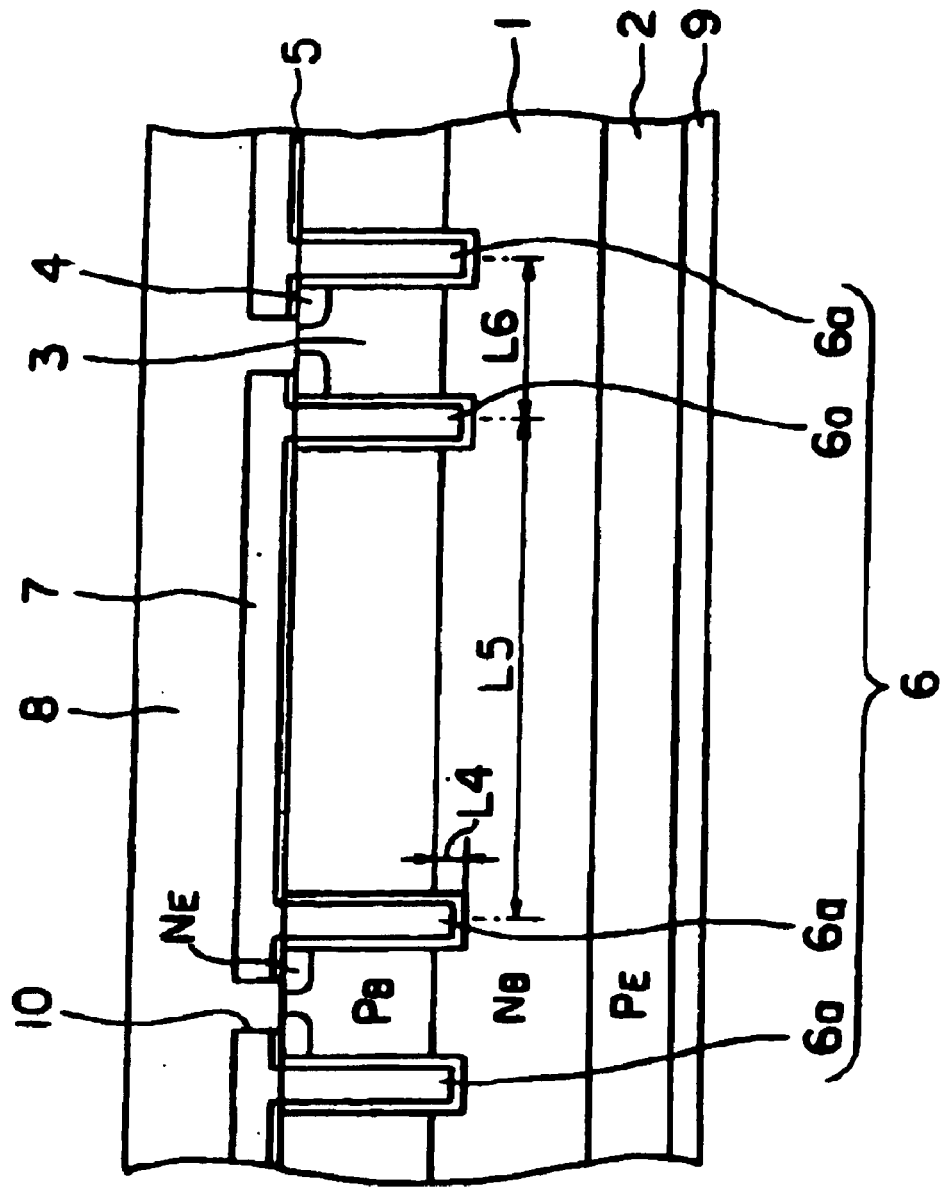
FIG. 10 is a sectional view showing a section of the insulating gate type semiconductor device (the trench gate type IEGT) in a third embodiment of the present invention.

FIG. 10 is a sectional view showing a structure of the section, taken along the straight line A–A' perpendicular to the trench gate electrode 6 of the trench gate type IEGT shown in FIG. 1, of the insulating gate type semiconductor device (trench gate type IEGT) in a third embodiment of the present invention. FIG. 10 is also the view corresponding to FIG. 5 showing the trench gate type IEGT in the first embodiment or FIG. 2 showing the prior art trench gate type IEGT.

The sectional structure of the trench gate type IEGT in the third embodiment of the present invention illustrated in FIG. 10, takes the following configuration. The N-type base layer 1 and the P-type base layer 3 are provided in sequence on the P-type emitter layer 2. Striped trenches for forming the trench gate electrode 6 are recessed substantially in parallel at predetermined intervals L5, L6, L5, L6, . . . extending from the substrate surface through the P-type base layer 3 down to an upper portion of the N-type base layer 1. The gate oxide layer 5 is formed on the substrate surface and internal surfaces of the trenches. The trench gate electrode 6 defined as a gate electrode composed of polysilicon with a resistance reduced, is provided in the interior of the trench covered with the gate oxide layer 5.

There are a set of two trench gate electrodes 6 arranged at the predetermined interval L5 in the trench gate type IEGT in the third embodiment of the present invention. The two trench gate electrodes 6 constituting one set of electrodes are each classified as the channel-forming trench gate electrode 6a, and the thinning-out trench gate electrode 6b is not provided between one channel-forming trench gate electrode 6a belonging to one set of electrodes and the other channel-forming trench gate electrode 6a. Further, an interval between the channel-forming trench gate electrode 6a belonging to one set of electrodes and the cannel-forming trench gate electrode 6a belonging to another set of electrodes adjacent to the above one set, is the predetermined interval L6.

The N-type emitter layer 4 is provided on the substrate surface of the P-type base layer 3 interposed between the channel-forming trench gate electrode 6a belonging to one set of electrodes and the cannel-forming trench gate electrode 6a belonging to another set of electrodes adjacent to the above one set as well as being provided in the vicinity of the channel-forming trench gate electrode 6a.

The insulating oxide layer 7 is provided covering some portions or the whole of the upper surfaces of the channel-forming trench gates 6a and the gate oxide layers 5 on the substrate surface. the contact hole 10 is holed in the insulating oxide layer 7 and the gate oxide layer 5 at the center of an inter-trench area formed with the N-type emitter layer 4. The emitter electrode 8 is provided over the entire surface of the substrate surface, covering all these layers and holes described above. Moreover, the collector electrode 9 is provided covering the entire surface of the P-type emitter layer 2 on the underside of the substrate. Accordingly, the emitter electrode 8 is connected at the contact hole 10 to the N-type emitter layer 4 and the P-type base layer 3.

Further, in the trench gate type IEGT in the third embodiment of the present invention, the sectional structure taken along the straight line B–B' shown in FIG. 1 is the same as the sectional structure of the section corresponding to the second section of the prior art trench gate IEGT shown in FIG. 3. Moreover, a plan view of the trench gate type IEGT in the third embodiment of the present invention in the region C in FIG. 1, shows a state where all the thinning-out trench gate electrodes 6b are eliminated out of the plan view of the prior art trench gate type IEGT shown in FIG. 4.

In the trench gate type IEGT in the third embodiment of the present invention, the predetermined interval L5 between the channel-forming trench gate electrode 6a belonging to one set of electrodes and the channel-forming trench gate 6a belonging to another set of electrodes adjacent to the above one set, and the predetermined interval L6 between the two channel-forming trench gate electrodes 6a constituting one set, are equal to those in the constructions in the first and second embodiments and in the prior art. In particular, the predetermined interval L5 is, because of an ON-characteristic of the element being determined by this internal L5, required to be fixed in the case of obtaining the same ON-characteristic.

Further, in the trench gate type IEGT in accordance with the third embodiment of the present invention, a depth to which the trench is recessed is set so that a distance L4 from the junction surface between the N-type base layer 1 and the P-type base layers 3 down to the trench bottom surface is a predetermined distance or smaller. Namely, the distance L4 is set to a distance to such an extent that a depletion layer formed extending from a tip of the channel-forming trench gate electrode 6a when in a forward voltage application is fused with a depletion layer formed extending from the junction area between the N-type base layer 1 and P-type base layer 3 to which the channel-forming trench gate electrode 6a concerned is vicinal and that a curvature of the depletion layer at the tip of the channel-forming trench gate electrode 6a is relieved. A specific value of the distance L4 may be, it is conceived, approximately 3 μm or under in a presumable example according to the third embodiment.

In the trench gate type IEGT in the third embodiment of the present invention, with the construction given above, the depletion layer formed extending from the tip of the channel-forming trench gate electrode 6a when in the forward voltage application, is fused with the depletion layer formed extending from the junction area between the N-type base layer and the P-type base layer 3 to which the channel-forming trench gate electrode 6a concerned is vicina, and the curvature of the depletion layer at the tip of the channel-forming trench gate electrode 6a is relieved. Therefore, even if there is not thinning-out trench gate electrode, the element withstand voltage does not decrease, and the thinning-out trench gate electrode becomes unnecessary. Accordingly, there is no necessity for providing the connection area between the thinning-out trench gate electrode and the emitter electrode. Hence, it is feasible to attain a large enhancement of the manufacturing yield as compared with the embodiments discussed above, and besides there occurs no such problem as a crystal distortion etc attributed to an internal stress of the trench by decreasing the number of trenches within the single element. Further, since there is no thinning-out trench gate electrode vicinal to the channel-forming trench gate electrode, the gate capacitance between the gate and the emitter is also reduced, and it is possible also in this embodiment to obtain the trench gate type IEGT of which the oscillations of waveforms of voltage and current when in switching are small in the case of the element having the large area and operating the elements in parallel.

What is claimed is:

1. An insulating gate type semiconductor device comprising:

a semiconductor substrate on which a P-type emitter layer, an N-type base layer and a P-type base layer are formed in sequence from the underside thereof to the surface thereof;

a plurality of trenches arranged substantially in parallel throughout said semiconductor substrate and each recessed at a first distance (L5) and a second distance (L6) alternately, lower ends of said trenches extending to a predetermined depth from the surface of said semiconductor substrate to an upper portion of said N-type base layer;

a gate insulating film provided on an inner surface of each of said trenches and on the surface of said semiconductor substrate;

a gate wire for transmitting a voltage applied to a gate;

a plurality of sets of trench gate electrodes each provided in said each trench formed with said gate insulating film and connected to said gate wire, with one set of said trench gate electrodes being constituted by two arranged in sequence at the first distance (L5), and said first distance (L5) is greater than said second distance (L6);

an N-type emitter layer provided in the surface part of said P-type base layer having a length of said second distance (L6) interposed between said trench gate electrode belonging to said one set of electrodes and said trench gate electrodes belonging to another set of electrodes adjacent to said one set of electrodes, and in the vicinity of said trench gate electrode;

an insulating layer provided covering a part or the whole of said trench gate electrode, and holed with contact holes at each of portions provided with said P-type base layer and said N-type emitter layer;

an emitter electrode provided covering said insulating layer and connected to said P-type base layer and said N-type emitter layer; and a collector electrode provided on said P-type emitter layer on the underside of said semiconductor substrate;

wherein the predetermined depth of the trench is set to such an extent that a depletion layer formed extending from a tip of said trench gate electrode at a voltage lower than that which generates breakdown when a forward voltage is applied, fuses with a depletion layer formed extending from a junction area between said N-type base layer and said P-type base layer to which said trench gate electrode is vicinal and such that a curvature of said depletion layer at the tip of said trench gate electrode is relieved.

2. An insulating gate type semiconductor device according to claim 1, wherein the predetermined depth of the trench is such a depth that a depth from the junction surface between said N-type base layer and said P-type base layer is 3 µm or less.

3. An insulating gate type semiconductor device comprising:

a semiconductor substrate on which a P-type emitter layer, an N-type base layer and a P-type base layer are formed in sequence from the underside thereof to the surface thereof;

a plurality of trenches arranged substantially in parallel throughout said semiconductor substrate, said plurality of trenches constituting a set of trenches, each set of trenches being disposed at an interval having a first distance (L5), each of said set of trenches having a second distance (L6) between both end trenches, and said first distance (L5) is greater than said second distance (L6);

an N-type emitter provided in the surface part of said P-type base layer having a width of the second distance;

a gate insulating film provided at least on an inner surface of each of said trenches;

a gate wire for transmitting a voltage applied to a gate;

a plurality of sets of trench gate electrodes each provided in said each trench formed with said gate insulating film and connected to said gate wire;

an insulating layer provided covering said trench gate electrode, and holed with contact holes at each of portions with said P-type base layer and said N-type emitter layer;

an emitter electrode provided covering said insulating layer and connected to said P-type base layer and said N-type emitter layer; and a collector electrode provided on the underside of said P-type emitter layer, wherein lower ends of said trenches extending to a depth from the surface of said semiconductor substrate to an upper portion of said N-type base layer to such an extent that a depletion layer formed extending from a tip of said trench gate electrode at a voltage lower than that which generates breakdown when a forward voltage is applied, fuses with a depletion layer formed extending from a junction area between said N-type base layer and said P-type base layer to which said trench gate electrode is vicinal and such that a curvature of said depletion layer at the tip of said trench is relieved.

4. An insulating gate type semiconductor device according to claim 3, wherein the predetermined depth of the trench is such a depth that a depth from the junction surface between said N-type base layer and said P-type base layer is 3 µm or less.

5. An insulating gate type semiconductor device according to claim 3, wherein said insulating layer is provided on the part or whole surface of said trench gate electrodes on said P-type base layer between a set of trenches and a next set of trenches.

6. An insulating gate type semiconductor device comprising:

a semiconductor substrate on which a P-type emitter layer, an N-type base layer and P-type base layers are formed in sequence from the underside thereof to the surface thereof;

a plurality of trenches arranged substantially in parallel throughout said semiconductor substrate and each recessed at a first distance (L5) and a second distance (L6) alternately, lower ends of said trenches extending to a predetermined depth from the surface of said semiconductor substrate to an upper portion of said N-type base layer, a gate insulating film provided on an inner surface of each of said trenches and on the surface of said semiconductor substrate;

a gate wire for transmitting a voltage applied to a gate;

a plurality of sets of trench gate electrodes each provided in said each trench formed with said gate insulating film and connected to said gate wire, with one set of said trench gate electrodes being constituted by two arranged in sequence at the first distance (L5), and said first distance (L5) is greater than said second distance (L6);

a plurality of N-type emitter layers provided in the surface parts of said P-type base layers having a length of said second distance (L6) interposed between said trench gate electrode belonging to said one set of electrodes and said trench gate electrode belonging to another set of electrodes adjacent to said one set of electrodes and in the vicinity of said trench gate electrode;

an insulating oxide layer provided covering a part or the whole of said trench gate electrode, and holed with contact holes at each of portions provided with said P-type base layers and said N-type emitter layers;

an emitter electrode provided covering said insulating layer and connected commonly to said P-type base layers and said N-type emitter layers; and a collector electrode provided on said P-type emitter layer on the underside of said semiconductor substrate, wherein the predetermined depth of the trench is set to such an extent that a depletion layer formed extending from a tip of said trench gate electrode at a voltage lower than that which generates breakdown when a forward voltage is applied, fuses with a depletion layer formed extending from a junction area between said N-type base layer and said P-type base layer to which said trench gate electrode is vicinal and such that a curvature of said depletion layer at the tip of said trench gate electrode is relieved.

7. An insulating gate type semiconductor device according to claim 6, wherein the predetermined depth of the trench is such a depth that a depth from the junction surface between said N-type base layer and said P-type base layer is 3 µm or less.

8. An insulating gate type semiconductor device comprising:

a semiconductor substrate on which a P-type emitter layer, an N-type base layer and a P-type base layer are formed in sequence from the underside thereof to the surface thereof;

a plurality of trenches arranged substantially in parallel throughout said semiconductor substrate, said plurality of trenches constituting set of trenches, each set of trenches being disposed at an interval having a first distance (L5), each of said set of trenches having a second distance (L6) between both end trenches, said first distance (L5) is greater than said second distance (L6);

an N-type emitter provided in the surface part of said P-type base layer having a width of the second distance;

a gate insulating film provided at least on an inner surface of each of said trenches;

a gate wire for transmitting a voltage applied to a gate;

a plurality of sets of trench gate electrodes each provided in said each trench formed with said gate insulating film and connected to said gate wire;

an insulating layer provided coveting said trench gate electrode, and holed with contact holes at each of portions with said P-type base layer and said N-type emitter layer;

an emitter electrode provided covering said insulating layer and connected to said P-type base layer and said N-type emitter layer; and a collector electrode provided on the underside of said P-type emitter layer, wherein lower ends of said trenches extending to a depth from the surface of said semiconductor substrate to an upper portion of said N-type base layer to such an extent that a depletion layer formed extending from a tip of said trench gate electrode at a voltage lower than that which generates breakdown when a forward voltage is applied, fuses with a depletion layer formed extending from a junction area between said N-type base layer and said P-type base layer to which said trench gate electrode is vicinal and such that a curvature of said depletion layer at the tip of said trench is relieved.

9. An insulating gate type semiconductor device according to claim 8, wherein the predetermined depth of the trench is such a depth that a depth from the junction surface between said N-type base layer and said P-type base layer is 3 $\mu$m or less.

10. An insulating gate type semiconductor device according to claim 8, wherein said insulating layer is provided on the part or whole surface of said trench gate electrodes on said P-type base layer between a set of trenches and a next set of trenches.

* * * * *